United States Patent
Wakao

(10) Patent No.: US 6,174,783 B1
(45) Date of Patent: Jan. 16, 2001

(54) SEMICONDUCTOR DEVICE HAVING A IMPROVED TRENCH STRUCTURE MANUFACTURING METHOD THEREOF, AND SEMICONDUCTOR DEVICE MANUFACTURING APPARATUS

(75) Inventor: Kazutoshi Wakao, Tokyo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/121,113

(22) Filed: Jul. 23, 1998

(30) Foreign Application Priority Data

Jan. 26, 1998 (JP) .................................................. 10-012559

(51) Int. Cl.[7] .................................................. H01L 21/76
(52) U.S. Cl. .......................... 438/400; 438/509; 438/530; 438/653; 505/427; 505/473; 505/475; 505/480
(58) Field of Search .................................... 438/400, 799, 438/530, 509, 653; 364/469, 468; 505/473, 480, 427, 475

(56) References Cited

U.S. PATENT DOCUMENTS 5,439,877 * 8/1995 Face ...................................... 505/475
5,770,026 * 6/1998 Lee ....................................... 204/298
5,815,396 * 9/1998 Shimamura et al. ................. 364/469

FOREIGN PATENT DOCUMENTS 3-134175   6/1991   (JP) .

* cited by examiner

Primary Examiner—David Nelms
Assistant Examiner—Phuc T. Dang
(74) Attorney, Agent, or Firm—McDermott, Will & Emery

(57) ABSTRACT

The front surface of a semiconductor substrate is formed with a trench. An insulating film is formed on the front surface of the semiconductor substrate including the trench while the bottom of the trench is kept at a higher temperature than the surface opening of the trench. To this end, the back surface of the semiconductor substrate is kept at a higher temperature than the front surface. This is done by heating the back surface of the semiconductor substrate with a halogen lamp. Alternatively, the front surface temperature is made lower than the back surface temperature by blowing a gas for forming an insulating film against the front surface of the semiconductor substrate.

7 Claims, 4 Drawing Sheets

SEMICONDUCTOR DEVICE HAVING A IMPROVED TRENCH STRUCTURE MANUFACTURING METHOD THEREOF, AND SEMICONDUCTOR DEVICE MANUFACTURING APPARATUS

BACKGROUND OF THE INVENTION

1. Field of the Invention

The present invention relates to a semiconductor device having a trench structure and its manufacturing method. In particular, the invention relates to a semiconductor device and its manufacturing method which include a structure or a method of covering a trench formed in a semiconductor substrate with an insulating film.

2. Background Art

FIGS. 8 and 9 are schematic sectional views illustrating formation of an insulating film in a conventional semiconductor device manufacturing method. That is, FIGS. 8 and 9 show the main part in steps of forming a trench for, for instance, device isolation in a semiconductor substrate and covering the trench with an insulating film.

The manufacturing steps will be described below with reference to FIGS. 8 and 9. First, as shown in FIG. 8, the surface of a semiconductor substrate 1 is formed with a device isolation trench 2 by etching or the like. An insulating film 3 is formed by CVD or the like so as to cover the trench 2.

FIG. 8 shows the initial stage of the formation of the insulating film 3. Although the insulating film 3 is normally formed on the surface of the semiconductor substrate 1 excluding the trench 2, on the side surfaces 5 of the trench 2 it is formed at a relatively small thickness at a low density. In particular, the insulating film 3 is not grown sufficiently on the bottom 6 of the trench 2.

FIG. 9 shows the final stage of the formation of the insulating film 3, in which the insulating film 3 grows so as to close the surface opening 4 of the trench 2. In this state, the insulating film 3 is not sufficiently grown inside the trench 2, particularly on its bottom 6; there is a possibility that an insulator portion 7 having a low density or an interstice is formed.

As described above, in the insulating film forming method of the conventional semiconductor device manufacturing method, in the step of covering the trench 2 formed in the semiconductor substrate 1 with the insulating film 3, the surface opening 4 of the trench 2 is closed by the part of the insulating film 3 that has grown on the surface of the semiconductor substrate 1. Therefore, the low-density insulator portion 7 may be formed inside the trench 2.

More specifically, in the trench isolation structure for device isolation of a semiconductor device, when an insulating film is formed by an ordinary CVD method or a like technique in filling in a trench with the insulating film, it is difficult to satisfactorily form the insulating film in the deepest portion of the trench, possibly forming a low-density insulator portion. This may render the device isolation incomplete and hence adversely affect the electrical characteristics.

SUMMARY OF THE INVENTION

The present invention has been made to solve the above problems in the conventional art, and an object of the present invention is therefore to provide a semiconductor device manufacturing method and apparatus which can bury, with superior coverage, an insulating film in a trench that is formed in a semiconductor substrate, as well as a semiconductor device having an insulating film that has been formed by the above manufacturing method and apparatus and is superior in burying performance.

According to one aspect of the present invention, in a manufacturing method of a semiconductor device, a semiconductor substrate, having a trench formed on the front surface thereof, is accommodated in a processing chamber to form an insulating film on the front surface of said semiconductor substrate. A reactive gas for forming an insulating film is introduced into the processing chamber. The semiconductor substrate accommodated in the processing chamber is heated from a back side of the semiconductor substrate. Thereby, an insulating film is formed on the front surface of the semiconductor substrate.

In another aspect of the present invention, in the manufacturing method, the insulating film is formed while a back surface of the semiconductor substrate is kept at a higher temperature than the front surface thereof.

In another aspect of the present invention, in the manufacturing method, the insulating film is formed in a high vacuum state in which a surface reaction on the semiconductor substrate is dominant over a vapor-phase reaction.

In the manufacturing method, the insulating film is formed preferably while a back surface of the semiconductor substrate is heated.

In the manufacturing method, the insulating film is formed preferably while a back surface and the front surface of the semiconductor substrate are heated so that the front surface is kept at a lower temperature than the back surface.

In the manufacturing method, the insulating film is preferably formed while the front surface of the semiconductor substrate is kept at a lower temperature than the back surface thereof by blowing a gas for forming the insulating film against the front surface of the semiconductor substrate.

In the manufacturing method, the insulating film is preferably formed while heat dissipation from the front surface of the semiconductor substrate is accelerated, the front surface of the semiconductor substrate being roughened in advance except for the trench.

According to one aspect of the present invention, a manufacturing apparatus of a semiconductor device comprises a processing chamber for accommodating a semiconductor substrate to form an insulating film on a front surface of said semiconductor substrate. Reactive gas introducing means is provided for introducing a reactive gas for forming the insulating film into the processing chamber. Firstheating means is provided for heating the semiconductor substrate accommodated in the processing chamber from a back side of the semiconductor substrate. Thereby, the insulating film is formed on the front surface of the semiconductor substrate while the semiconductor substrate is heated from the backside thereof.

In another aspect of the present invention, the manufacturing apparatus further comprises second heating means for heating the semiconductor substrate accommodated in the processing chamber from a front side of the semiconductor substrate. Thereby, the insulating film is formed on the front surface of the semiconductor substrate while the front surface of the semiconductor substrate is kept at a lower temperature than a back surface thereof.

In another aspect of the present invention, the manufacturing apparatus further comprising heating adjusting means provided between the second heating means and the front surface of the semiconductor substrate, for adjusting a degree of heating on the front surface of the semiconductor substrate.

In another aspect of the present invention, in the manufacturing apparatus, the reactive gas introducing means may adjust a temperature of the front surface of the semiconductor substrate by blowing the reactive gas against the front surface of the semiconductor substrate.

Other and further objects, features and advantages of the invention will appear more fully from the following description.

BEAT MODE OF CARRYING OUT THE INVENTION

Figure 1:
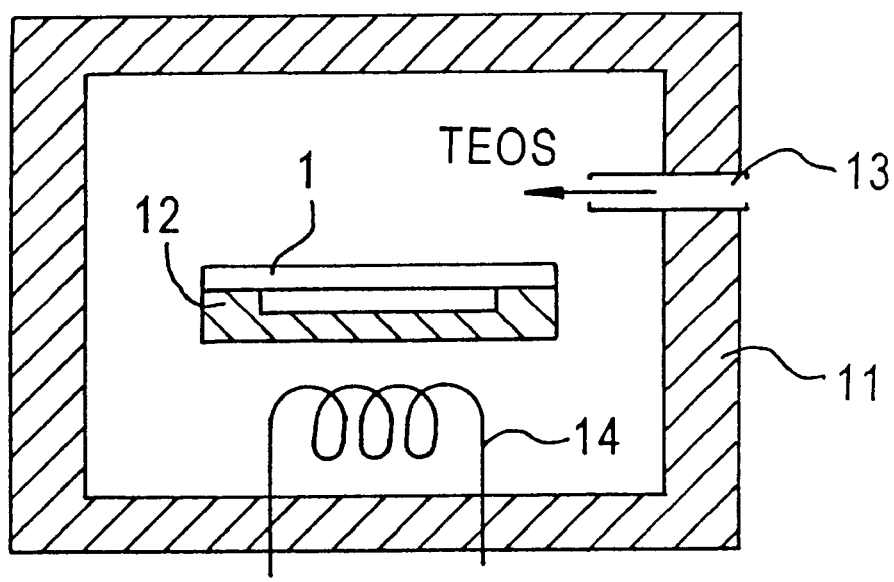
FIG. 1 is a sectional view showing a configuration of an insulating film forming apparatus according to a first embodiment of the present invention.

The embodiments of the present invention will be hereinafter described with reference to the accompanying drawings. The same reference numerals in the drawings represent the same or equivalent parts.

FIRST EMBODIMENT

Figure 2:
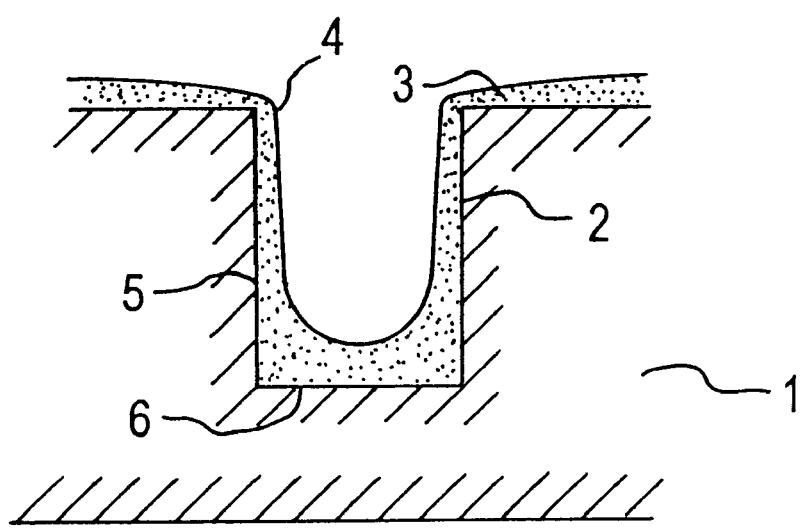
FIGS. 2 and 3 are schematic sectional views illustrating formation of an insulating film according to each embodiment of the present invention.
Figure 3:
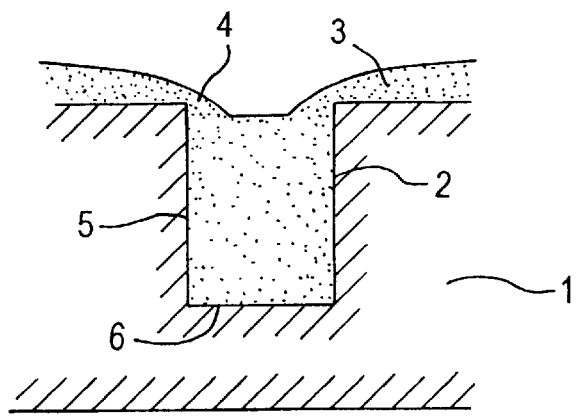

FIG. 1 is a sectional view showing a configuration of a semiconductor device manufacturing apparatus, specifically an insulating film forming apparatus, according to a first embodiment of the present invention. FIGS. 2 and 3 are schematic sectional views illustrating formation of an insulating film according to each of the first and the other embodiments.

In FIG. 1, reference numeral 1 denotes a semiconductor substrate; 11, a processing chamber in which to form an insulating film on the surface of the semiconductor film 1 that is accommodated in the chamber 11 itself; and 12, a holder for holding the semiconductor substrate 1. Reference numeral 13 denotes a gas introducing means for introducing, into the chamber 11, a reactive gas for forming an insulating film. A specific example of the gas introducing means 13 is a nozzle. Reference numeral 14 denotes a heating means (first heating means) for heating the semiconductor substrate 1 from the back side. A specific example of the heating means 14 is a halogen lamp.

Next, an insulating film forming step of this embodiment will be described.

First, a semiconductor substrate 1 in which a trench is formed in its front surface is set on the semiconductor substrate holder 12, and the holder 12 is then placed in the chamber 11. The chamber 11 is one capable of providing a degree of vacuum of 0.133 Pa ($10^{-3}$ Torr) or less. After the mounting of the semiconductor substrate 1, the degree of vacuum in the chamber 11 is reduced to 0.133 Pa ($10^{-3}$ Torr) with a high vacuum pump.

Then, the semiconductor substrate 1 is heated with the halogen lamp 14 whose output power is set at 30 kW so that the back surface temperature of the semiconductor substrate 1 reaches 700° C. Since the holder 12 holds the semiconductor substrate 1 with a ring-shaped member, it does not interrupt heat rays coming from the halogen lamp 14 that is provided on the back side.

Then, while tetraethoxysilane (TEOS) that is a material gas for forming a silicon oxide film as an insulating film is supplied through the nozzle 13, the pressure inside the chamber 11 is kept at 40 Pa (0.3 Torr), whereby an insulating film is formed on the front surface of semiconductor substrate 1.

In an example of a conventional insulating film forming method, a chamber itself is heated to 700° C. for instance, and a semiconductor substrate that is placed in the chamber is heated, mainly from the front side, by radiation heat from the wall of the chamber. In contrast, in this embodiment, it is not necessary to heat the chamber 11 itself to, for instance, 700° C.; the back surface of the semiconductor substrate 1 is heated to, for instance, 700° C. with the halogen lamp 14.

FIGS. 2 and 3 illustrate formation of an insulating film on the semiconductor substrate 1 according to this embodiment.

FIG. 2 shows the initial stage of the formation of an insulating film. As seen from FIG. 2, not only is an insulating film 3 normally grown on the front surface of the semiconductor film 1, but it is grown on the bottom 6 of a trench 2 so as to have a large thickness and a sufficiently high density.

This is because of the following reasons. By properly heating the back surface of the semiconductor substrate 1 in the above manner, the temperature of the back surface becomes higher than that of the front surface; that is, a temperature gradient is formed between the front surface and the back surface of the semiconductor substrate 1. As a result, a temperature gradient is also formed in the trench 2 in such a manner that the temperature of the bottom 6 of the trench 2 is higher than that of the front opening 4. Because of the existence of this temperature gradient, the insulator forming rate on the bottom 6 is higher than that in the vicinity of the front opening 4 of the trench 2, and hence the insulating film 3 starts to grow earlier on the bottom 6 of the trench 2.

Further, after a high degree of vacuum of 0.133 Pa ($10^{-3}$ Torr) or less is provided in the chamber 11, the reaction gas is supplied and the insulating film 3 is formed in a vacuum state of 40 Pa (0.3 Torr) or less. Therefore, as for the mechanism of forming the insulating film 3, what is called the surface reaction is dominant over the vapor-phase reaction; the rate of formation of the insulating film 3 is determined by the surface reaction. In this manner, the rate of formation of the insulating film 3 can be made higher on the bottom 6 of the trench 2 that is kept at a higher temperature.

FIG. 3 shows the final stage of the formation of the insulating film 3. Since the insulating film 3 starts to grow at a high rate on the bottom 6 of the trench 2, finally the insulating film 3 is formed inside the trench 2 at a sufficiently high density.

This solves the problem of conventional methods that the opening 4 of the trench 2 is closed by the portion of the insulating film 3 that has grown on the front surface of the semiconductor substrate 1 before the insulating film 3 sufficiently grows inside the trench 2. Therefore, a low-density insulator portion is not formed inside the trench 2, and hence the trench 2 can be uniformly covered with the insulating film 3.

In an example of a conventional method, in filling in a trench whose aspect ratio is 3 or more (for instance, the width and the depth are 0.3 μm and 1.0 μm, respectively) with an insulating film, a cavity may be formed at a position close to the bottom of the trench. In contrast, in this embodiment, no cavity is formed even in filling in such a trench, and the trench can be filled in by an insulating film having a sufficiently high density.

As described above, in the present embodiment, in filling in an isolation trench formed in a semiconductor substrate with an insulating film by CVD or the like, a temperature gradient is formed in the thickness direction of the semiconductor substrate, i.e., in the depth direction of the isolation trench, in such a manner that the temperature is higher in a deep portion of the trench than in a shallow portion (a portion in the vicinity of the substrate front surface), to provide a difference in surface reaction rate. As a result, the covering with the insulating film starts from the deep portion of the isolation trench, whereby a trench isolation structure with superior insulating film coverage can be obtained.

Therefore, according to this embodiment, in a semiconductor device having a trench isolation structure, an insulating film can be buried with superior coverage, and hence the device isolation characteristic can be improved.

Stated in general terms, an insulating film that is superior in coverage and burying performance can be formed.

SECOND EMBODIMENT

Figure 4:
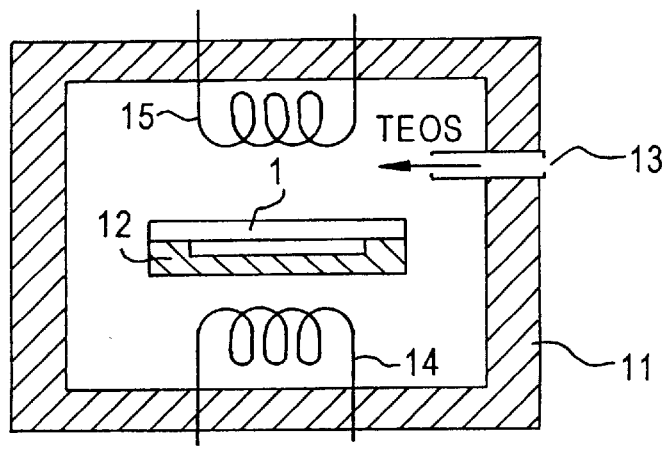
FIG. 4 shows a configuration of an insulating film forming apparatus according to a second embodiment of the present invention.

FIG. 4 shows the configuration of a semiconductor device manufacturing apparatus, specifically an insulating film forming apparatus, according to a second embodiment of the present invention.

In FIG. 4, reference numeral 15 denotes a heating means (second heating means) for heating a semiconductor substrate 1 from the front side. A specific example of the heating means 15 is a halogen lamp. The degree of heating on the front surface of the semiconductor substrate 1 by the front-side halogen lamp 15 is set lower than that of heating on its back surface by the back-side halogen lamp 14. To this end, the output power of the halogen lamp 15 is set lower than that of the halogen lamp 14, or the distances between the semiconductor substrate 1 and the halogen lamps 14 and 15 are properly adjusted. For example, the output power of the back-side halogen lamp 14 is set at 30 kW and that of the front-side halogen lamp 15 is set at 5 kW. Since the other components are the same as shown in FIG. 1, redundant descriptions therefor are omitted.

By using the above-configured apparatus, an insulating film is formed on the front surface of the semiconductor substrate 1 in the same manner as in the first embodiment.

According to this embodiment, an insulating film superior in coverage and burying performance can be formed as in the case of the first embodiment. Further, in this embodiment, because of the use of the halogen lamp 15 that is additionally provided on the front side of the semiconductor substrate 1, the temperature of the front surface of the semiconductor substrate 1 can also be controlled. Therefore, the controllability of the thickness of an insulating film formed on the front surface of the semiconductor substrate 1 can be improved from the case of the first embodiment in which only the back surface of the semiconductor substrate 1 is heated.

Further, in this embodiment, the controllability of the temperature difference between the front surface and the back surface of the semiconductor substrate 1 is improved, which means improved controllability of an insulating film grown on the bottom of the trench 2.

THIRD EMBODIMENT

Figure 5:
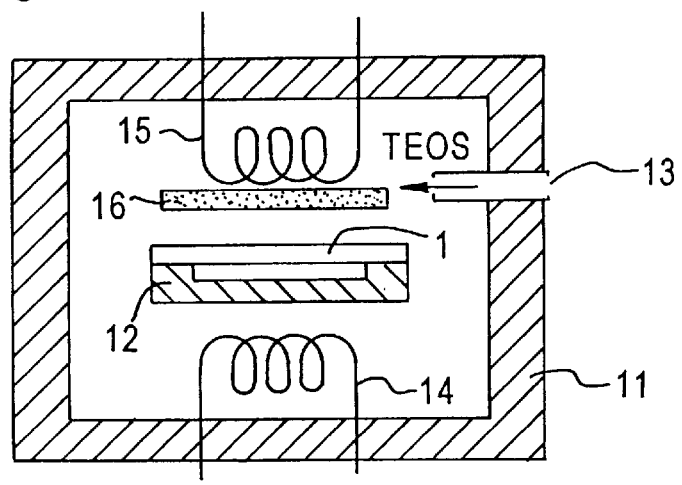
FIG. 5 shows a configuration of an insulating film forming apparatus according to a third embodiment of the present invention.

FIG. 5 shows the configuration of a semiconductor device manufacturing apparatus, specifically an insulating film forming apparatus, according to a third embodiment of the invention.

In FIG. 5, reference numeral 16 denotes a heating adjusting means for the heating on the front surface of a semiconductor substrate 1. A specific example of the heating adjusting means 16 is a quartz plate. Inserted between the semiconductor substrate 1 and a halogen lamp 15 for heating the semiconductor substrate 1 from the front side, the quartz plate 16 adjusts transmission of heat rays coming from the halogen lamp 15, thereby adjusting the front surface temperature of the semiconductor substrate 1. Since the other components are the same as shown in FIG. 4, redundant descriptions therefor are omitted.

In this embodiment, because of the insertion of the quartz plate 16, the degree of heating on the front surface can be made lower than that of heating on the back surface, even if, for example, the output power of the front-side halogen lamp 15 is equivalent to that of the back-side halogen lamp 14. The degree of heating on the front surface can be adjusted by switching among quartz plates 16 having different degrees of heat transmission.

By using the above-configured apparatus, an insulating film is formed on the front surface of the semiconductor substrate 1 in the same manner as in the first embodiment.

According to this embodiment, an insulating film superior in coverage and burying performance can be formed as in the case of the second embodiment. Further, in this embodiment, since the heating temperature of the front surface of a semiconductor substrate can be controlled, the controllability of the thickness of an insulating film formed on the front surface can be improved.

FOURTH EMBODIMENT

Figure 6:
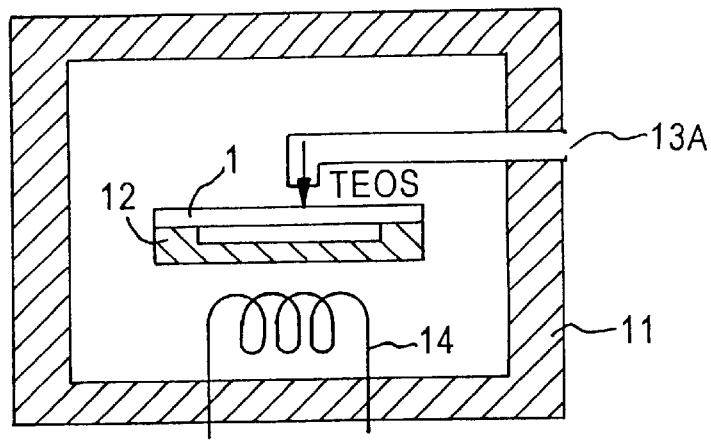
FIG. 6 shows a configuration of an insulating film forming apparatus according to a fourth embodiment of the present invention.

FIG. 6 shows the configuration of a semiconductor device manufacturing apparatus, specifically an insulating film forming apparatus, according to a fourth embodiment of the present invention.

In FIG. 6, reference numeral 13A denotes a gas introducing means for introducing a reactive gas for forming an insulating film into the chamber 11. A specific example of the gas introducing means is a nozzle. This embodiment is different from the first embodiment in that the nozzle 13A is configured so as to extend into the chamber 11 and blow the reactive gas against the front surface of a semiconductor substrate 1. Since the other components are the same as shown in FIG. 1, redundant descriptions therefor are omitted.

In this embodiment, since the nozzle 13A is disposed so that its blowing outlet is directed to the front surface of the semiconductor substrate 1, the front surface of the semiconductor substrate 1 can be cooled by the insulator material gas, whereby the front surface temperature of the semiconductor substrate 1 can further be decreased from the back surface temperature. That is, by blowing, against the front surface of the semiconductor substrate 1, the material gas that is sufficiently lower in temperature than the semiconductor substrate 1, the front surface temperature can be decreased efficiently, and hence a sufficiently large temperature difference can be obtained between the front surface and the back surface of the semiconductor substrate 1. In general, the temperature of a tube for supplying a TEOS gas to the nozzle 13A is set at about 100° C., the front surface of the semiconductor substrate 1 can be cooled sufficiently by the TEOS gas.

By using the above-configured apparatus, an insulating film is formed on the front surface of the semiconductor substrate 1 in the same manner as in the first embodiment.

According to this embodiment, an insulating film superior in coverage and burying performance can be formed as in the case of the first embodiment. Further, since the difference between the front surface temperature (lower) and the back surface temperature (higher) of the semiconductor substrate 1 in this embodiment can be made larger than in the first embodiment in which only the back surface of the semiconductor substrate 1 is heated, the rate of formation of an insulating film on the front surface of the semiconductor substrate 1 can be made lower than in the first embodiment. Therefore, the opening of the trench of the semiconductor substrate 1 can be made less prone to be closed than in the first embodiment.

FIFTH EMBODIMENT

Figure 7:
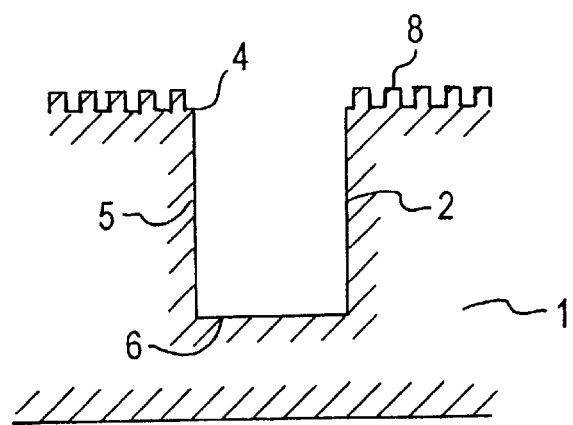
FIG. 7 is an illustration for explaining a semiconductor manufacturing method according to a fifth embodiment of the present invention.
Figure 8:
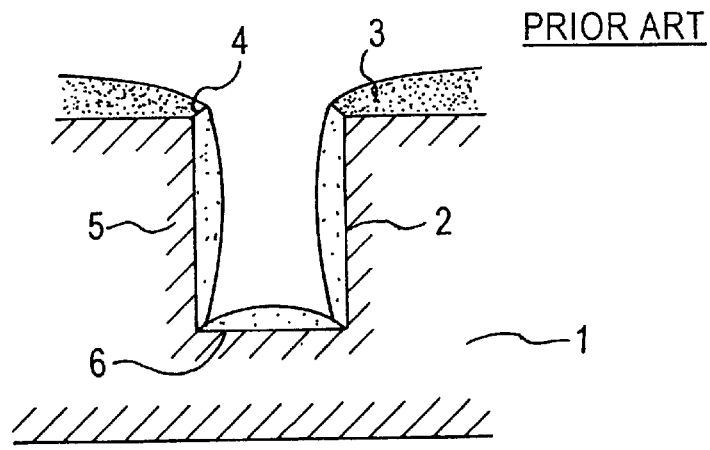
FIGS. 8 and 9 are schematic sectional views illustrating formation of an insulating film in a conventional semiconductor device manufacturing method.
Figure 9:
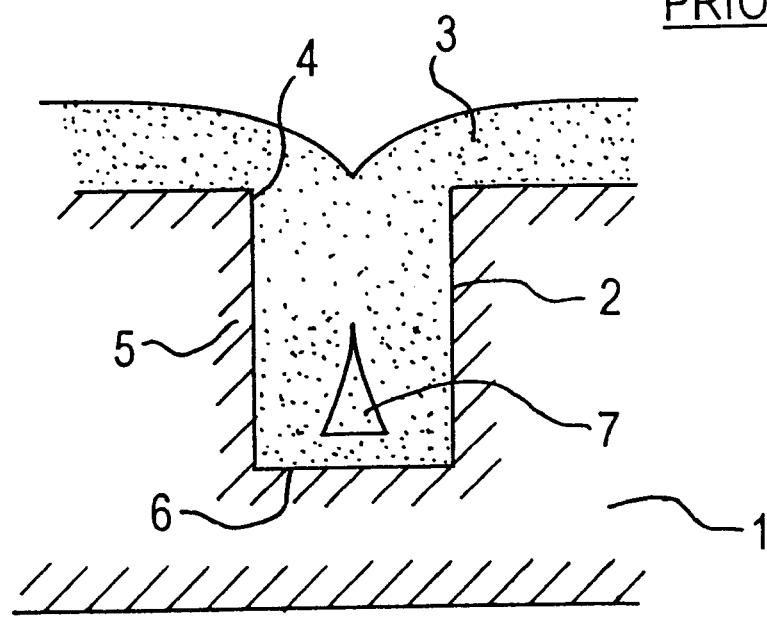

FIG. 7 is an illustration for explaining a semiconductor manufacturing method according to a fifth embodiment of the present invention.

As shown in FIG. 7, in this embodiment, the front surface, excluding the portion where a trench 2 is formed, of a semiconductor substrate 1 on which an insulating film is to be formed has been formed with asperities 8 in advance. The shape and the size of the surface asperities 8 may be determined appropriately. In other words, it can be said that the front surface of the semiconductor substrate 1 is roughened.

In this embodiment, after the front surface of a semiconductor substrate 1 on which an insulating film is to be formed is roughened as described above except for the portion where the trench 2 for device isolation is formed, an insulating film is formed on the front surface of the semiconductor substrate 1 by using the insulating film forming apparatus according to any of the first to fourth embodiments. Since the insulating film forming method is the same as in the first to fourth embodiments, redundant descriptions therefor are omitted.

According to this embodiment, heat dissipation from the front surface of the semiconductor substrate 1 is enhanced, and hence the front surface temperature of the semiconductor substrate 1 can be made even lower than the back surface temperature.

Since the difference between the front surface temperature (lower) and the back surface temperature (higher) of the semiconductor substrate 1 in this embodiment can be made larger than in the first embodiment in which only the back surface of the semiconductor substrate 1 is heated, the rate of formation of an insulating film on the front surface of the semiconductor substrate 1 can be made lower than in the first embodiment. Therefore, the opening of the trench of the semiconductor substrate 1 can be made less prone to be closed than in the first embodiment.

It was not described in the above embodiments that in general the semiconductor substrate 1 is formed with a plurality of trenches 2. Regions on the surface of the semiconductor substrate 1 are isolated from each other by the trenches, and a semiconductor device is formed in each of the isolated regions. That is, the plurality of trenches 2 serve as isolation trenches for isolating device forming regions from each other.

In general, after the insulating film 3 is formed according to each of the above embodiments, the insulating film 3 is etched back to leave it only in the trenches 2. Transistors, capacitors, and other elements are formed in the regions where the insulating film 3 has been removed, to form an intended circuit.

The above embodiments are directed to the case of filling in a trench for device isolation with an insulating film. For example, this aspect of the invention is applied to various kinds of semiconductor devices as typified by semiconductor memories such as the DRAM and the SRAM.

However, the invention is not limited to such a case and can broadly be applied to cases where an insulating film or a dielectric film is formed in a trench. For example, the invention can be applied to a case of burying a dielectric in a trench to form a capacitor trench.

Semiconductor device manufacturing steps before and after the formation of an insulating film according to each of the above embodiments are not the characterizing part of the invention and may be ordinary manufacturing steps. Therefore, such steps are not described in detail in this specification.

However, the invention provides a semiconductor device manufacturing method that includes the insulating film forming method according to any of the above embodiments, as well as a semiconductor device in which an insulating film is buried, with superior coverage, in a trench of a semiconductor substrate according to any of the embodiments.

As described above, according to the invention, in a process of covering a trench of a semiconductor substrate with an insulating film, the back surface temperature of the semiconductor substrate is increased to provide a temperature difference between the front surface and the back surface. As a result, the rate of formation of an insulating film on the bottom of the trench that is closer to the back surface of the semiconductor substrate is increased, to provide a difference in the rate of formation of an insulating film between a portion close to the surface opening of the trench and a portion close to the bottom of the trench. This enables an insulating film to start growing earlier on the bottom of the trench, whereby an insulating film having superior coverage can be formed inside the trench.

Specifically, in a semiconductor device having a trench isolation structure, an insulating film can be buried with superior coverage, and hence the device isolation characteristic can be improved.

It is further understood that the foregoing description is a preferred embodiment of the disclosed device and that various changes and modifications may be made in the invention without departing from the spirit and scope thereof.

What is claimed is:

1. A manufacturing apparatus of a semiconductor device, comprising:

a processing chamber for accommodating a semiconductor substrate to form an insulating film on a front surface of said semiconductor substrate;

reactive gas introducing means for introducing a reactive gas for forming said insulating film by surface reaction with the semiconductor substrate into said processing chamber;

first heating means for heating said semiconductor substrate accommodated in said processing chamber from a back side of said semiconductor substrate, wherein said insulating film is formed on said front surface of said semiconductor substrate by surface reaction with the semiconductor substrate while said semiconductor substrate is heated from said backside thereof.

2. The manufacturing apparatus according to claim 1, further comprising second heating means for heating said semiconductor substrate accommodated in said processing chamber from a front side of said semiconductor substrate, wherein said insulating film is formed on said front surface of said semiconductor substrate while said front surface of said semiconductor substrate is kept at a lower temperature than a back surface thereof.

3. The manufacturing apparatus according to claim 2, further comprising heating adjusting means provided between said second heating means and said front surface of said semiconductor substrate, for adjusting a degree of heating on said front surface of said semiconductor substrate.

4. The manufacturing apparatus according to claim 1, wherein said reactive gas introducing means adjusts a temperature of said front surface of said semiconductor substrate by blowing said reactive gas against said front surface of said semiconductor substrate.

5. A manufacturing apparatus of a semiconductor device, comprising:

a processing chamber;

a substrate holder;

a semiconductor substrate positioned on the holder, said semiconductor substrate having a trench formed therein;

a source of reactive gas for forming an insulating layer on a front surface of the semiconductor substrate;

reactive gas introducing means for introducing the reactive gas into said processing chamber; and first heating means for heating said semiconductor substrate positioned on said processing chamber from a back side of said semiconductor substrate, wherein said insulating film is formed on said front surface of said semiconductor substrate while said semiconductor substrate is heated from said backside thereof.

6. The manufacturing device according to claim 5, wherein said semiconductor substrate is formed of silicon and wherein the reactive gas oxidizes the surface the silicon to form a layer of silicon oxide which comprises the insulating layer.

7. The manufacturing device according to claim 6, wherein the reactive gas oxidizes the silicon surface of said semiconductor substrate such that a layer of silicon oxide which is formed at the bottom of the trench having a thickness greater than the silicon oxide layer formed on an upper surface of said semiconductor substrate due to the heating of the semiconductor substrate from said underside thereof which increases a temperature at the bottom of the trench.

* * * * *